(12) United States Patent
Tang

(10) Patent No.: US 12,360,846 B2
(45) Date of Patent: Jul. 15, 2025

(54) APPARATUS, SYSTEM, AND METHOD FOR OPERATING MEMORY SYSTEM

(71) Applicant: YANGTZE MEMORY TECHNOLOGIES CO., LTD., Wuhan (CN)

(72) Inventor: Zhihua Tang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 104 days.

(21) Appl. No.: 18/219,579

(22) Filed: Jul. 7, 2023

(65) Prior Publication Data

US 2024/0403164 A1 Dec. 5, 2024

Related U.S. Application Data

(63) Continuation of application No. PCT/CN2023/097795, filed on Jun. 1, 2023.

(51) Int. Cl.
*G06F 11/10* (2006.01)
*G06F 11/14* (2006.01)

(52) U.S. Cl.
CPC ...... *G06F 11/1048* (2013.01); *G06F 11/1068* (2013.01); *G06F 11/1469* (2013.01)

(58) Field of Classification Search
CPC ............. G06F 11/1048; G06F 11/1068; G06F 11/1469; G06F 11/1012; G06F 11/1441; G11C 29/4401; G11C 2029/0409; G11C 2029/0411; G11C 5/148; G11C 11/5642; G11C 11/5671; G11C 16/26; G11C 16/0483; G11C 16/20; G11C 29/52
See application file for complete search history.

(56) References Cited

U.S. PATENT DOCUMENTS

| | | | |
|---|---|---|---|
| 9,653,157 B1* | 5/2017 | Kim | G11C 16/0483 |
| 2017/0300377 A1* | 10/2017 | Kaynak | H03M 13/3738 |
| 2018/0122490 A1* | 5/2018 | Kim | G11C 16/20 |
| 2019/0108091 A1 | 4/2019 | Chen | |
| 2020/0160906 A1* | 5/2020 | Lee | G06F 11/141 |
| 2020/0356438 A1 | 11/2020 | Kim et al. | |
| 2021/0103405 A1* | 4/2021 | Jang | G06F 3/0673 |

(Continued)

OTHER PUBLICATIONS

International Search Report International Search Report issued in corresponding International Application No. PCT/CN2023/097795, mailed on Dec. 5, 2023, 4 pages.

*Primary Examiner* — Albert Decady
*Assistant Examiner* — Osman M Alshack
(74) *Attorney, Agent, or Firm* — BAYES PLLC

(57) ABSTRACT

In one aspect, a method for operating a memory system that comprises a memory device is provided. The method includes, in response to determining a power-off occurrence of the memory system, initiating a power-off recovery (POR) procedure on the memory system; and in response to determining that a read error occurs during the POR procedure, performing one or more first read-retry operations on the memory device based on a plurality of first read-retry levels. The plurality of first read-retry levels are a portion of a plurality of second read-retry levels that are applied, during a standard read error handling procedure, in one or more second read-retry operations on the memory device.

20 Claims, 10 Drawing Sheets

(56) References Cited

U.S. PATENT DOCUMENTS

| | | | |
|---|---|---|---|
| 2022/0137836 A1* | 5/2022 | Kang | G06F 11/073 |
| | | | 714/6.11 |
| 2022/0171542 A1* | 6/2022 | Kim | G06F 3/065 |
| 2022/0310168 A1* | 9/2022 | Kang | G11C 29/52 |
| 2022/0342765 A1* | 10/2022 | Tan | G06F 1/3225 |
| 2023/0214299 A1* | 7/2023 | Venkataraman | G06F 11/1012 |
| | | | 714/6.24 |
| 2023/0342040 A1* | 10/2023 | Cho | G06F 3/0611 |
| 2023/0376217 A1* | 11/2023 | Lee | G06F 3/0673 |
| 2024/0127897 A1* | 4/2024 | Lee | G11C 16/26 |
| 2024/0201864 A1* | 6/2024 | Shin | G06F 3/0679 |

* cited by examiner

APPARATUS, SYSTEM, AND METHOD FOR OPERATING MEMORY SYSTEM

CROSS-REFERENCE TO RELATED APPLICATIONS

This application is a continuation of International Application No. PCT/CN2023/097795, filed on Jun. 1, 2023, entitled "APPARATUS, SYSTEM, AND METHOD FOR OPERATING MEMORY SYSTEM," which is incorporated herein by reference in its entirety.

BACKGROUND

The present disclosure relates to apparatuses, systems, and methods for operating a memory device. More particularly, it is related to apparatuses, systems, and methods for reducing the power-on time of a memory device after a power loss.

When a power loss occurs, it is crucial to maintain the integrity of data stored in a non-volatile memory device, such as a solid-state drive (SSD). To achieve this, the memory device needs to undergo a specific process after the power is back. This process is designed to verify the integrity of the stored data and ensure that the memory device is in a consistent state before allowing the memory system to resume its normal operation. Accordingly, the risk of data loss or corruption can be minimized, and the memory system can be restored to a stable state from the power loss.

SUMMARY

In the present disclosure, apparatuses, systems, and methods for operating a memory device are provided.

In one aspect, a method for operating a memory system that may include a memory device is provided. The method may include, in response to determining a power-off occurrence of the memory system, initiating a power-off recovery (POR) procedure on the memory system; and, in response to determining that a read error occurs during the POR procedure, performing one or more first read-retry operations on the memory device based on a plurality of first read-retry levels. The plurality of first read-retry levels may be a portion of a plurality of second read-retry levels that are applied, during a standard read error handling procedure, in one or more second read-retry operations on the memory device.

In some implementations, the read error during the POR procedure may include one of a first read error occurring in a quick boot table (QBT) recovery, a second read error occurring in restoring a table and data from a snapshot of a checkpoint, a third read error occurring in evaluating whether the table and data as restored are consistent, and a fourth read error occurring in updating the table.

In some implementations, the method may further include determining that the read error occurs when it is determined that, during the POR procedure, a read operation on the memory device fails in an error correction code (ECC) verification.

In some implementations, in response to determining the power-off occurrence, initiating the POR procedure may include determining whether a valid quick boot table (QBT) exists. The method may further include, in response to determining that a valid QBT exists, performing QBT recovery, and in response to determining that there is no valid QBT, performing a data re-storage procedure.

In some implementations, performing the data re-storage procedure may further include sorting memory blocks in the memory device according to timestamps; restoring a table and data from a snapshot of a checkpoint based on the memory blocks as sorted; evaluating whether the table and data as restored are consistent; and applying a change to the table according to a memory block of the memory blocks as restored.

In some implementations, each of the first read-retry levels may be selected from the second read-retry levels; and a number of the first read-retry levels may be less than a number of the second read-retry levels.

In some implementations, the first read-retry levels may be selected, from the second read-retry levels, according to at least one of a storage type of a memory cell in the memory device, a frequency of read errors, data importance, a type of the memory device, a data retention ability of the memory cell, a fresh-out-of-box (FOB) level of the memory device, a block close/block open state of a memory block in the memory device, whether the memory device is a redundant system, or error correction capability of the memory system.

In some implementations, the memory device may include a triple-level cell (TLC). The method may further include, in response to determining that the read error occurs during the POR procedure, performing one or more sticky read-retry operations on the memory device based on a plurality of sticky read-retry levels; and in response to determining that each of the one or more sticky read-retry operations fails in a corresponding ECC verification, performing one or more TLC read-retry operations on the memory device based on a plurality of TLC read-retry levels. The sticky read-retry levels may be a first portion of the second read-retry levels, the TLC read-retry levels may be a second portion of the second read-retry levels, and a number of the one or more sticky read-retry operations may be equal to a number of the sticky read-retry levels.

In some implementations, in response to determining that one of the one or more sticky read-retry operations passes an ECC verification, terminating the POR procedure on the memory system. The number of the one or more sticky read-retry operations may be less than or equal to the number of the sticky read-retry levels.

In some implementations, the method may further include, in response to determining that each of the one or more TLC read-retry operations fails in a corresponding ECC verification, performing soft decoding on the memory device. A number of the one or more TLC read-retry operations may be equal to a number of the TLC read-retry levels. The method may further include, in response to determining that the soft decoding fails in a corresponding ECC verification, performing redundant array of independent NANDs (RAIN) recovery.

In some implementations, the memory device may include a single-level cell (SLC). The method may include, in response to determining that the read error occurs during the POR procedure, performing one or more SLC read-retry operations on the memory device based on a plurality of SLC read-retry levels.

In some implementations, the method may further include, in response to determining that each of the one or more SLC read-retry operations fails in a corresponding ECC verification, performing soft decoding on the memory device. The number of the one or more SLC read-retry operations may be equal to a number of the SLC read-retry levels. The method may further include, in response to determining that the soft decoding fails in a corresponding ECC verification, performing RAIN recovery.

In some implementations, the method may further include retrieving the first read-retry levels from a read-retry table.

In some implementations, the read-retry table may be stored in the memory device.

In some implementations, the memory device may be a first memory device in the memory system. The read-retry table may be stored in a second memory device external to the memory system. The method may further include accessing the second memory device to retrieve the first read-retry levels from the read-retry table.

In another aspect, a non-transitory computer-readable storage medium is provided. The storage medium may be configured for storing computer-executable instructions that, when executed by a hardware processor, cause the hardware processor to: in response to determining a power-off occurrence of a memory system that may include a memory device, initiate a power-off recovery (POR) procedure on the memory system; and in response to determining that a read error occurs during the POR procedure, perform one or more first read-retry operations on the memory device based on a plurality of first read-retry levels. The plurality of first read-retry levels may be a portion of a plurality of second read-retry levels that are applied, during a standard read error handling procedure, in one or more second read-retry operations on the memory device.

In still another aspect, a memory system is provided. The memory system may include a memory device and a memory controller. The memory controller may be configured to, in response to determining a power-off occurrence of the memory system, initiate a power-off recovery (POR) procedure; and, in response to determining that a read error occurs, during the POR procedure, acquire a plurality of first read-retry levels. The plurality of first read-retry levels may be a portion of a plurality of second read-retry levels that are applied, during a standard read error handling procedure, in one or more second read-retry operations on the memory device. The memory controller may be further configured to send a first address signal and a first instruction signal to the memory device to perform one or more first read-retry operations on the memory device. The first instruction signal may be generated based on the plurality of first read-retry levels.

In some implementations, the read error during the POR procedure may include one of a first read error occurring in a quick boot table (QBT) recovery, a second read error occurring in restoring a table and data from a snapshot of a checkpoint, a third read error occurring in evaluating whether the table and data as restored are consistent; and a fourth read error occurring in updating the table.

In some implementations, the memory controller may be further configured to determine that the read error occurs when it is determined that, during the POR procedure, a read operation on the memory device fails in an ECC verification.

In some implementations, the memory controller may be further configured to, in response to determining the power-off occurrence, determine whether there is a valid quick boot table (QBT); in response to determining that a valid GBT exists, send a second address signal and a second instruction signal to the memory device to perform a read operation on the memory device for QBT recovery in the POR procedure; and in response to determining that there is no valid QBT, perform a data re-storage procedure.

In some implementations, during the data re-storage procedure, the memory controller may be configured to sort memory blocks in the memory device according to timestamps, restore a table and data from a snapshot of a checkpoint based on the memory blocks as sorted, evaluate whether the table and data as restored are consistent, and apply a change to the table according to a memory block of the memory blocks as restored.

In some implementations, each level of the first read-retry levels may be selected from the second read-retry levels; and a number of the first read-retry levels may be less than a number of the second read-retry levels.

In some implementations, the first read-retry levels may be selected, from the second read-retry levels, according to at least one of a storage type of a memory cell in the memory device, a frequency of read errors, data importance, a type of the memory device, a data retention ability of the memory cell, a fresh-out-of-box (FOB) level of the memory device, a block close/block open state of a memory block in the memory device, whether the memory device is a redundant system, or error correction capability of the memory system.

In some implementations, the memory device may include a triple-level cell (TLC). The memory controller may be further configured to, in response to determining that the read error occurs during the POR procedure, send a third address signal and a third instruction signal to the memory device to perform one or more sticky read-retry operations on the memory device based on a plurality of sticky read-retry levels; and in response to determining that each of the one or more sticky read-retry operations fails in a corresponding error correction code (ECC) verification, send a fourth address signal and a fourth instruction signal to the memory device to perform one or more TLC read-retry operations on the memory device based on a plurality of TLC read-retry levels. The sticky read-retry levels may be a first portion of the second read-retry levels, the TLC read-retry levels may be a second portion of the second read-retry levels, and a number of the one or more sticky read-retry operations may be equal to a number of the sticky read-retry levels.

In some implementations, the memory controller may be further configured to, in response to determining that one of the one or more sticky read-retry operations passes an ECC verification, terminate the POR procedure. The number of the one or more sticky read-retry operations may be less than or equal to the number of the sticky read-retry levels.

In some implementations, the memory controller may be further configured to, in response to determining that each of the one or more TLC read-retry operations fails in a corresponding ECC verification, perform soft decoding on the memory device. A number of the one or more TLC read-retry operations may be equal to a number of the TLC read-retry levels. The memory controller may be further configured to, in response to the soft decoding fails in a corresponding ECC verification, perform RAIN recovery.

In some implementations, the memory device may include a single-level cell (SLC). The memory controller may be further configured to, in response to determining that the read error occurs during the POR procedure, send a fifth address signal and a fifth instruction signal to the memory device to perform one or more SLC read-retry operations on the memory device based on a plurality of SLC read-retry levels.

In some implementations, the memory controller may be further configured to, in response to determining that each of the one or more SLC read-retry operations fails in a corresponding ECC verification, perform soft decoding on the memory device. A number of the one or more SLC read-retry operations may be equal to a number of the SLC read-retry levels. The memory controller may be further configured to, in response to determining that the soft decoding fails in a corresponding ECC verification, perform RAIN recovery.

In some implementations, the memory controller may be further configured to retrieve the first read-retry levels from a read-retry table.

In some implementations, the memory device may be configured to store the read-retry table.

In some implementations, the memory device may be a first memory device in the memory system. A second memory device, external to the memory system, may be configured to store the read-retry table. The memory controller may be further configured to access the second memory device to obtain the first read-retry levels from the read-retry table in the second memory device.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
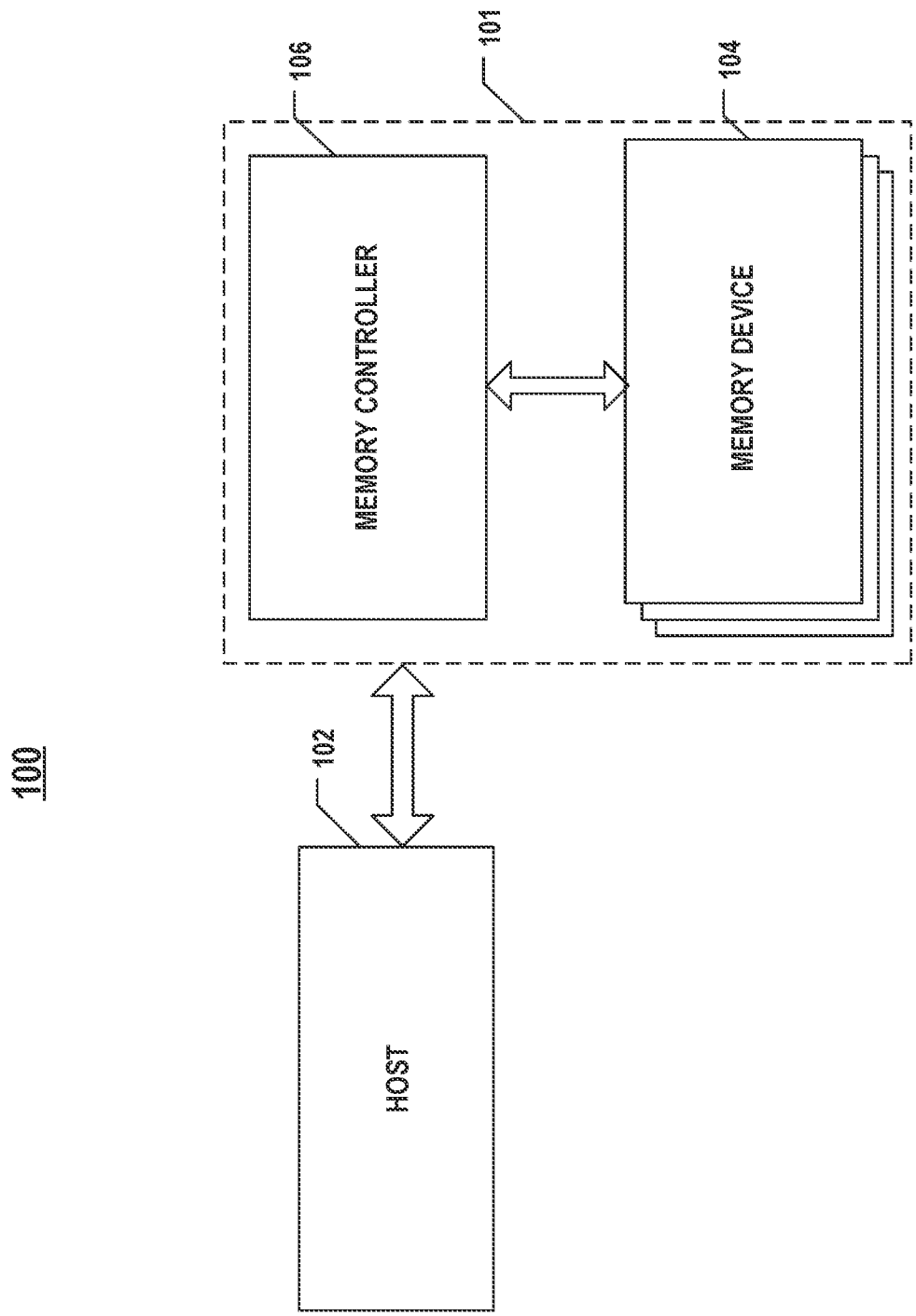
FIG. 1 illustrates a block diagram of an exemplary system having a host and a memory system, according to some aspects of the present disclosure.

Aspects of the present disclosure will be described with reference to the accompanying drawings.

DETAILED DESCRIPTION

Although specific configurations and arrangements are described, it should be understood that this is done for illustrative purposes only. As such, other configurations and arrangements can be used without departing from the scope of the present disclosure. Also, the present disclosure can be employed in a variety of other applications. Functional and structural features as described in the present disclosure can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the terms "based on" and "according to" may be understood as not necessarily intended to convey an exclusive set of factors and may, instead, allow for the existence of additional factors not necessarily expressly described, again, depending at least in part on context.

When a power loss or power-off occurs, it can have negative impacts on a non-volatile memory device, such as an SSD. For instance, if the memory device is in the middle of reading/writing data when the power loss occurs, the data being read and written may be lost or corrupted, which can degrade the performance and efficiency of the memory device. Additionally, the power loss can cause the memory system to corrupt, further exacerbating the issue.

To mitigate the negative effects of power loss on a memory device, several power-off recovery techniques have been developed. They are commonly applied to memory devices to ensure that the memory devices can start up in a known state after power is recovered. The power-off recovery procedures of the known approaches, however, are associated with extended power-on time, typically longer than 10 seconds. In some power-off recovery processes of the known approaches, a series of evaluation and recovery steps may be performed to ensure that the memory device is in a stable and consistent state, and these steps can take a significant amount of time. In some read error handling scenarios, the power-on time may be extended to multiples of 10 seconds. As a result, the system performance and reliability may be reduced, and the power consumption may increase.

From the above description, it can be understood that power-on time has become a crucial consideration in the design of a memory device or system, particularly in certain applications where a fast startup time is necessary (such as in a computer laptop), to improve user experience and satisfaction. The term "power-on time" used herein may refer to the amount of time it takes for an electronic device or system to fully power on and become operational (i.e., in a steady state) after a power loss. More specifically, regarding memory devices or systems, the term "power-on time" may refer to the amount of time it takes to fully power on and complete a read/program operation.

To address one or more of the aforementioned issues, some implementations of the present disclosure propose a solution in which an inventive read error handling flow is implemented in a power-off recovery (POR) procedure of a memory system. Based on the read error handling flow, the number of the read-retry levels can be reduced in the POR procedure, and thus the POR procedure can be simplified. As a consequence, power-on time can be shortened. In the following, some implementations of the present disclosure are described with reference to the accompanying drawings from FIG. 1 to FIG. 7.

FIG. 1 illustrates a block diagram of an exemplary system 100 having a host 102 and a memory system 101, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include host 102 and memory system 101 having one or more memory devices 104 and a memory controller 106.

Host 102 can be a processor of an electronic device, such as a central processing unit (CPU), or a system-on-chip (SoC), such as an application processor (AP). Host 102 can be coupled to memory controller 106 and configured to send data to or receive data from memory devices 104 through memory controller 106. For example, host 102 may send program data in a program operation or receive read data in a read operation. Host 102 can include a control unit (CU), or an arithmetic & logic unit (ALU) and can be configured to receive and transmit instructions and commands to and from memory controller 106 coupled to memory device 104, and execute or perform multiple functions and operations provided in the present disclosure, which will be described later.

Memory device 104 can be any memory device disclosed in the present disclosure, such as a NAND Flash memory device. It is noted that the NAND Flash memory device is only one example of a memory device for illustrative purposes. It can include any suitable solid-state, non-volatile memory, e.g., NOR Flash, Ferroelectric RAM (FeRAM), Phase-change memory (PCM), Magnetoresistive random-access memory (MRAM), Spin-transfer torque magnetic random-access memory (STT-RAM), or Resistive random-access memory (RRAM), etc. In some implementations, memory device 104 may include a three-dimensional (3D) NAND Flash memory device.

Memory controller 106 can be implemented by microprocessors, microcontrollers (a.k.a. microcontroller units (MCUs)), digital signal processors (DSPs), application-specific integrated circuits (ASICs), field-programmable gate arrays (FPGAs), programmable logic devices (PLDs), state machines, gated logic, discrete hardware circuits, and other suitable hardware, firmware, and/or software configured to perform the various functions described below in detail.

Memory controller 106 can be coupled to non-volatile memory device 104 and host 102 and can be configured to control non-volatile memory device 104, according to some implementations of the present disclosure. Memory controller 106 can manage the data stored in non-volatile memory device 104 and communicate with host 102. In some implementations, memory controller 106 may be designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 may be designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of non-volatile memory device 104, such as read, erase, and program operations, by providing instructions, such as read instructions, to non-volatile memory device 104. For example, memory controller 106 may be configured to provide a read instruction to the peripheral circuit of non-volatile memory device 104 to control the read operation.

Memory controller 106 can also be configured to manage various functions with respect to the data stored or to be stored in non-volatile memory device 104 including, but not limited to bad-block management, garbage collection, logical-to-physical address conversion, wear leveling, etc. In some implementations, memory controller 106 may be further configured to process error correction code (ECC) verification with respect to the data read from or written to non-volatile memory device 104. It can be understood that memory controller 106 may perform any other suitable functions, for example, formatting non-volatile memory device 104.

Memory controller 106 can communicate with host 102 or an external device according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
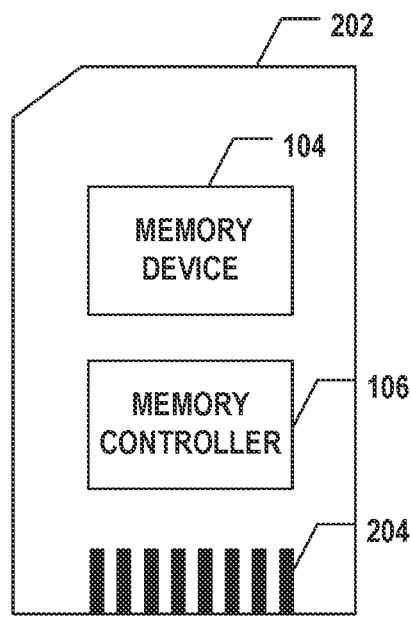
FIG. 2A illustrates a schematic diagram of an exemplary memory card having a memory device, according to some aspects of the present disclosure.
Figure 2B:
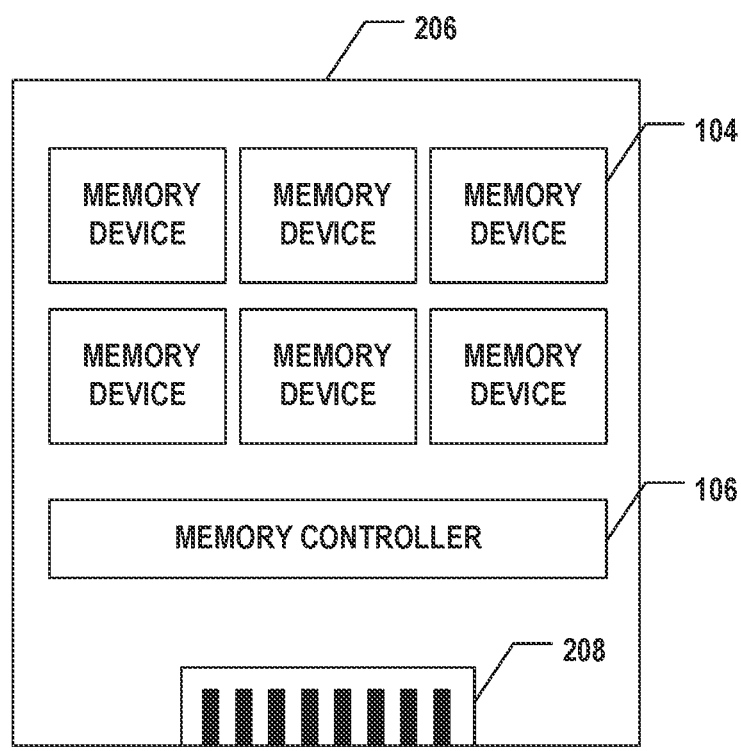
FIG. 2B illustrates a schematic diagram of an exemplary solid-state drive (SSD) having multiple memory devices, according to some aspects of the present disclosure.

Memory controller 106 and one or more non-volatile memory devices 104 can be integrated into diverse types of storage devices, for example, being included in the same package, such as a universal Flash storage (UFS) package or an eMMC package. That is, memory system 101 can be implemented and packaged into several types of end electronic products. In one example as shown in FIG. 2A, memory controller 106 and a single non-volatile memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (such as host 102 in FIG. 1). In another example as shown in FIG. 2B, memory controller 106 and multiple non-volatile memory devices 104 may be integrated into an SSD 206. SSD 206 can further include an SSD connector 208 coupling SSD 206 with a host (such as host 102 in FIG. 1). In some implementations, the storage capacity and/or the operation speed of SSD 206 can be greater than those of memory card 202.

Memory control 106 can be configured to receive a command from and transmit a command to host 102 and execute or perform multiple functions and operations provided in the present disclosure, which will be described later.

Figure 3A:
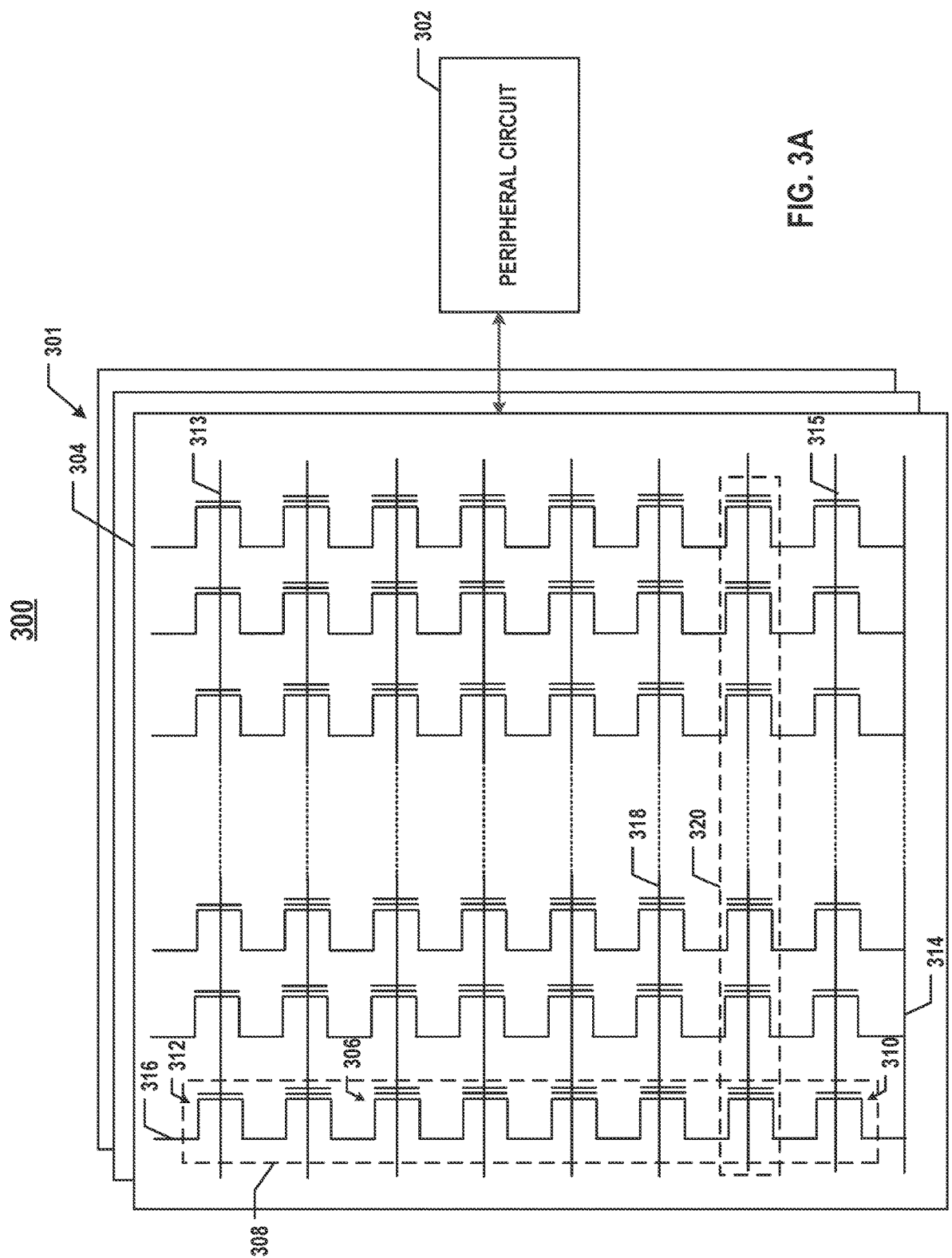
FIG. 3A illustrates a schematic diagram of an exemplary memory device having a memory cell array and peripheral circuits, according to some aspects of the present disclosure.

FIG. 3A illustrates a schematic diagram of an exemplary memory device 300 having a memory cell array 301 and peripheral circuits 302, according to some aspects of the present disclosure. Memory device 300 can be an example of non-volatile memory device 104 in FIG. 1. In some implementations, memory device 300 can be a NAND Flash memory device, which is only one example of the memory device for illustrative purposes. Memory device 300 can include any suitable solid-state, non-volatile memory, e.g., NOR Flash, FeRAM, PCM, MRAM, STT-RAM, or RRAM, etc. Memory device 300 can include memory cell array 301 and peripheral circuits 302 coupled to memory cell array 301. Memory cell array 301 can be a NAND Flash memory cell array in which memory cells 306 are provided in the form of an array of NAND memory strings 308 each extending vertically above a substrate (not shown). In some implementations, each NAND memory string 308 includes a plurality of memory cells 306 coupled in series and stacked vertically. Each memory cell 306 can hold a continuous, analog value, such as an electrical voltage or charge, which depends on the number of electrons trapped within a region of memory cell 306. Each memory cell 306 can be either a floating gate type of memory cell including a floating-gate transistor or a charge trap type of memory cell including a charge-trap transistor.

In some implementations, each memory cell 306 can be a single-level cell (SLC) that has two possible memory states and thus can store one bit of data. For example, the first memory state "0" can correspond to the first range of voltages, and the second memory state "1" can correspond to the second range of voltages. In some implementations, each memory cell 306 can be a multi-level cell (MLC) that is capable of storing more than a single bit of data in more than four memory states. For example, the MLC can store two bits per cell, three bits per cell (also known as triple-level cell (TLC)), or four bits per cell (also known as a quad-level cell (QLC)). Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3A, each NAND memory string 308 can further include a source select gate (SSG) transistor 310 at its source end and a drain select gate (DSG) transistor 312 at its drain end. SSG transistor 310 and DSG transistor 312 can be configured to activate selected NAND memory strings 308 (columns of the array) during read and program operations. In some implementations, the sources of NAND memory strings 308 in the same memory block 304 can be coupled through the same source line 314, e.g., a common source line. In other words, all NAND memory strings 308 in the same memory block 304 may have an array common source (ACS), according to some implementations. The drain of DSG transistor 312 of each NAND memory string 308 may be coupled to a respective bit line 316 from which data can be read or written via an output bus (not shown), according to some implementations. In some implementations, each NAND memory string 308 can be configured to be selected or deselected by applying a select voltage (e.g., above the threshold voltage of DSG transistor 312) or a deselect voltage (e.g., 0 V) to the gate of respective DSG transistor 312 through one or more DSG lines 313 and/or by applying a select voltage (e.g., above the threshold voltage of SSG transistor 310) or a deselect voltage (e.g., 0 V) to the gate of respective SSG transistor 310 through one or more SSG lines 315.

As shown in FIG. 3A, NAND memory strings 308 can be organized into multiple memory blocks 304, each of which can have a common source line 314, e.g., coupled to the ACS. In some implementations, each memory block 304 can be the basic data unit for erase operations, i.e., all memory cells 306 on the same memory block 304 can be erased at the same time. To erase memory cells 306 in a selected memory block 304, source lines 314 coupled to selected memory block 304 as well as unselected memory blocks 304 in the same plane as selected memory block 304 can be biased with an erase voltage (Vers), such as a high positive voltage (e.g., 20 V or more). Certain memory cells 306 of NAND memory strings 308 can be coupled through word lines 318 that select which row of memory cells 306 is affected by the read and program operations. In some implementations, each word line 318 can be coupled to a physical page 320 of memory cells 306, which is the basic data unit for program and read operations. The size of one physical page 320 in bits can relate to the number of NAND memory strings 308 coupled by word line 318 in one memory block 304.

Peripheral circuits 302 can be coupled to memory cell array 301 through bit lines 316, word lines 318, source lines 314, SSG lines 315, and DSG lines 313. Peripheral circuits 302 can include any suitable analog, digital, and mixed-signal circuits for facilitating the operations of memory cell array 301 by applying and sensing voltage signals and/or current signals to and from each target memory cell 306 through bit lines 316, word lines 318, source lines 314, SSG lines 315, and DSG lines 313, etc. Peripheral circuits 302 can include various types of peripheral circuitry formed using metal-oxide-semiconductor (MOS) technologies.

It can be understood that FIG. 3A is merely provided as an example. Although FIG. 3A shows certain exemplary components, a memory device consistent with the scope of the present disclosure may further include one or more other components (such as a top dummy cell) or omit some components. The present disclosure does not limit thereto.

Figure 3B:
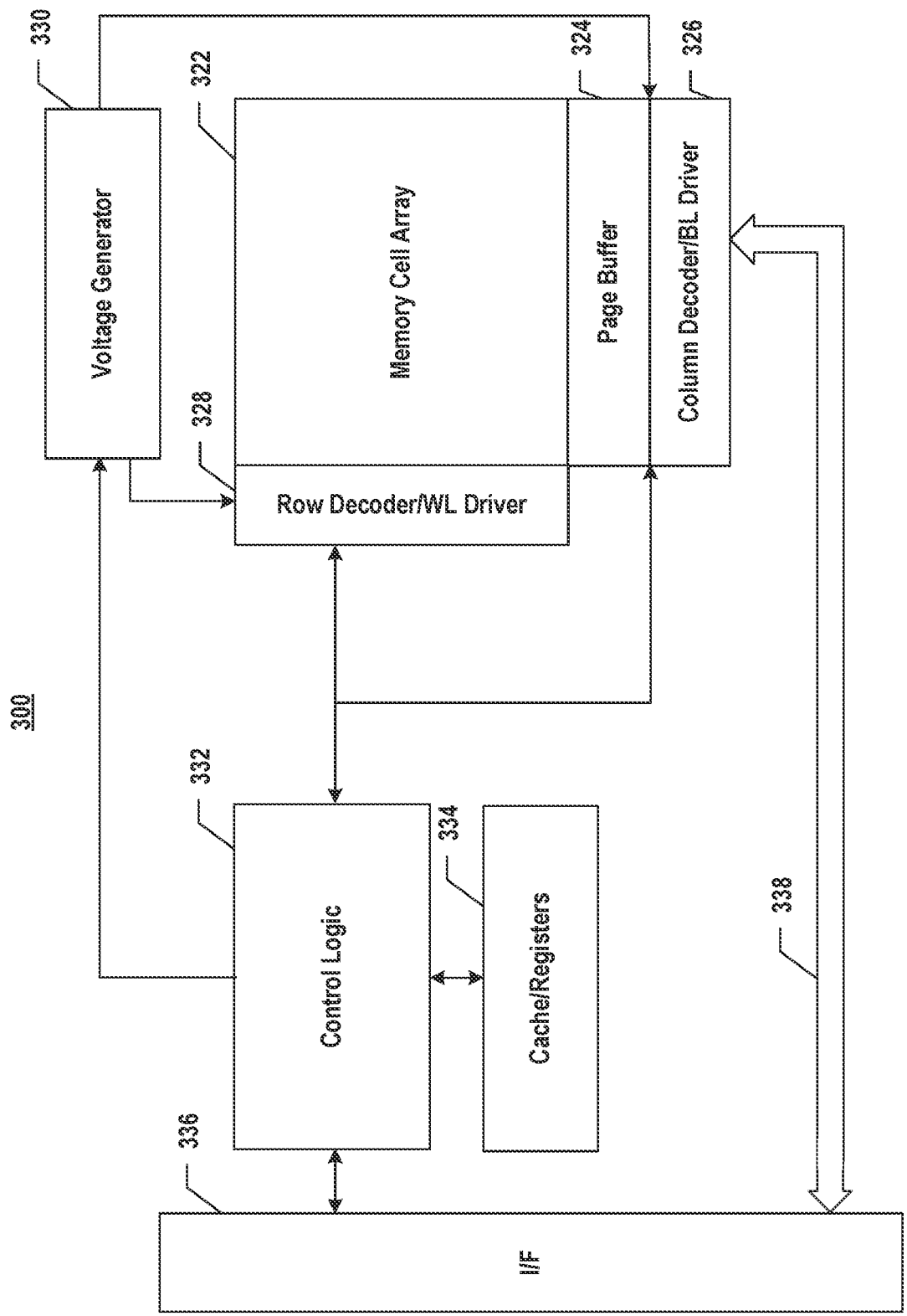
FIG. 3B illustrates a schematic diagram of another exemplary memory device having a memory cell array and peripheral circuits, according to some aspects of the present disclosure.

FIG. 3B illustrates a schematic diagram of another exemplary memory device 300 having a memory cell array 322 and peripheral circuits, according to some aspects of the present disclosure. Memory cell array 301 in FIG. 3A can be an example of memory cell array 322 in FIG. 3B, while FIG. 3B may depict some examples of peripheral circuits 302 in FIG. 3A.

Returning to FIG. 3A, peripheral circuits 302 can be coupled with memory cell array 301 through bit lines 316, word lines 318, source line 314, DSG line 313, SSG line 315, etc. Peripheral circuits 302 can include any suitable circuits for facilitating the operations of memory cell array 301 by applying and sensing voltage signals and/or current signals through bit lines 316 to and from each target memory cell 306 through bit lines 316, word lines 318, source line 314, DSG line 313, and SSG line 315. Peripheral circuits 302 can include diverse types of peripheral circuitry formed using complementary metal-oxide semiconductor (CMOS) technologies. For example, FIG. 3B provides some exemplary peripheral circuits 302 that may include a page buffer/sense amplifier 324, a column decoder/bit line driver 326, a row decoder/word line driver 328, a voltage generator 330, control logic 332, cache/registers 334, an interface (I/F) 336, and a data bus 338. It can be understood that in some examples, additional peripheral circuits not shown in FIG. 3B may be included as well.

Page buffer/sense amplifier 324 can be configured to buffer data read from or programmed to memory cell array 301 according to control signals issued by control logic 332. In some examples, page buffer/sense amplifier 324 may store one page of program data (write data) to be programmed into one physical page 320 (shown in FIG. 3A) of memory cell array 301. In some examples, page buffer/sense amplifier 324 may also perform program verification operations to ensure that the data has been properly programmed into memory cells 306 coupled to a selected word line.

Row decoder/word line driver 328 can be configured to be controlled by control logic 332 to select a memory block 304 of memory cell array 301 and a word line 318 of selected memory block 304. Row decoder/word line driver 328 can be further configured to drive memory cell array 301. For example, row decoder/word line driver 328 may drive memory cells 306 coupled to the selected word line using a voltage generated from voltage generator 330.

Column decoder/bit line driver 326 may be controlled by control logic 332 to select one or more NAND memory strings 308 (shown in FIG. 3A) by applying a bit line voltage generated from voltage generator 330. For example, column decoder/bit line driver 326 may apply column signals for selecting a set of N bits of data from page buffer/sense amplifier 324 to be output in a read operation.

Control logic 332 can be coupled to each peripheral circuit 302 (shown in FIG. 3A) and configured to control operations of peripheral circuits 302. Cache/registers 334 can be coupled to control logic 332 and may include status registers, command registers, and address registers for storing status information, command operation codes (OP codes), and command addresses for controlling the operations of each peripheral circuit 302.

Interface 336 can be coupled to control logic 332 and configured to interface memory cell array 301 with a memory controller (such as memory controller 106 in FIG. 1). In some implementations, interface 336 may function as a control buffer to buffer and relay control commands received from the memory controller and/or a host (such as host 102 in FIG. 1) to control logic 332 and status information received from control logic 332 to the memory controller and/or the host. Interface 336 can also be coupled to page buffer/sense amplifier 324 and column decoder/bit line driver 326 via data bus 338 and function as an I/O interface and a data buffer to buffer and relay the program data received from the memory controller and/or the host to page buffer/sense amplifier 324 and the read data from page buffer/sense amplifier 324 to the memory controller and/or the host. In some implementations, interface 336 and data bus 338 can be parts of an I/O circuit of peripheral circuits 302.

Voltage generator 330 may be controlled by control logic 332 to generate word line voltages (e.g., a read voltage, a programming voltage, a pass voltage, and a verification voltage), and bit line voltages to be supplied to memory cell array 301. In some examples, voltage generator 330 may also generate a drain select voltage supplied to DSG line 313, a source select voltage supplied to SSG line 315, a source voltage to source line 314, etc. In some implementations, voltage generator 330 can be part of a voltage source that provides voltages at various levels of different peripheral circuits 302 as described below in detail. Consistent with the scope of the present disclosure, in some implementations, the voltages provided by voltage generator 330, for example, to row decoder/word line driver 328, column decoder/bit line driver 326, and page buffer/sense amplifier 324 may be above certain levels that can be sufficient to perform the memory operations. For example, the voltages provided to the page buffer circuits in page buffer/sense amplifier 324 and/or the logic circuits in control logic 332 may be, e.g., between 1.3 V and 5 V, such as 3.3 V, and the voltages provided to the driving circuits in row decoder/word line driver 328 and/or column decoder/bit line driver 326 may be, e.g., between 5 V and 30 V.

Figure 4A:
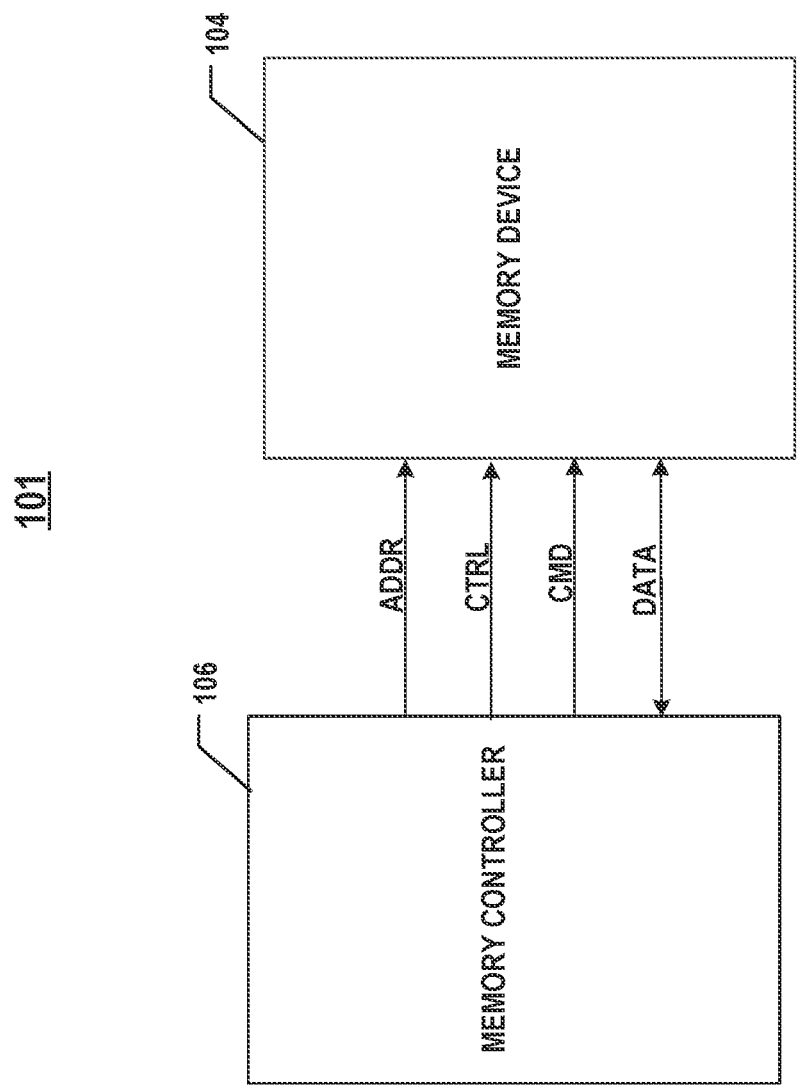
FIG. 4A illustrates a schematic diagram showing various exemplary communication signals between a memory controller and a memory device, according to some aspects of the present disclosure.

FIG. 4A illustrates a schematic diagram showing various exemplary communication signals between a memory controller 106 and a non-volatile memory device 104, according to some aspects of the present disclosure. As described above, memory controller 106 may be responsible for managing the communication between a host (such as host 102 in FIG. 1) and non-volatile memory device 104. For this purpose, memory controller 106 may send various signals to non-volatile memory device 104 through specific communication channels and receive data from non-volatile memory device 104.

The communication signals may include an address signal ADDR. Address signal ADDR may carry a memory address (a location of non-volatile memory device 104) that memory controller 106 attempts to access. The memory address may represent a specific location in non-volatile memory device 104 where the data is stored and requested by the host.

The communication signals sent from memory controller 106 to non-volatile memory device 104 may include control signal CTRL. Control signal CTRL may provide control information necessary for non-volatile memory device 104 to perform specific operations such as a read, program, refresh, or precharge operation. In some implementations, control signal CTRL may be encoded with various control bits that can specify timing, duration, and other parameters of the operations.

Among the communication signals, a command signal CMD may be configured to initiate an operation on non-volatile memory device 104. More specifically, command signal CMD may carry a command that can specify an operation that memory controller 106 instructs non-volatile memory device 104 to execute. In some examples, command signal CMD may include read, program, refresh, and precharge operations. Control signal CTRL and command signal CMD may be included in and termed as "an instruction signal" in the present disclosure.

FIG. 4A also shows a data signal DATA. Data signal DATA can be a bidirectional signal that can carry actual data requested or attempted to write by memory controller 106. Data signal DATA can be used in a read operation or a program operation, which means that data signal DATA can be transferred in both directions, from memory controller 106 to non-volatile memory device 104 or from non-volatile memory device 104 to memory controller 106.

Figure 4B:
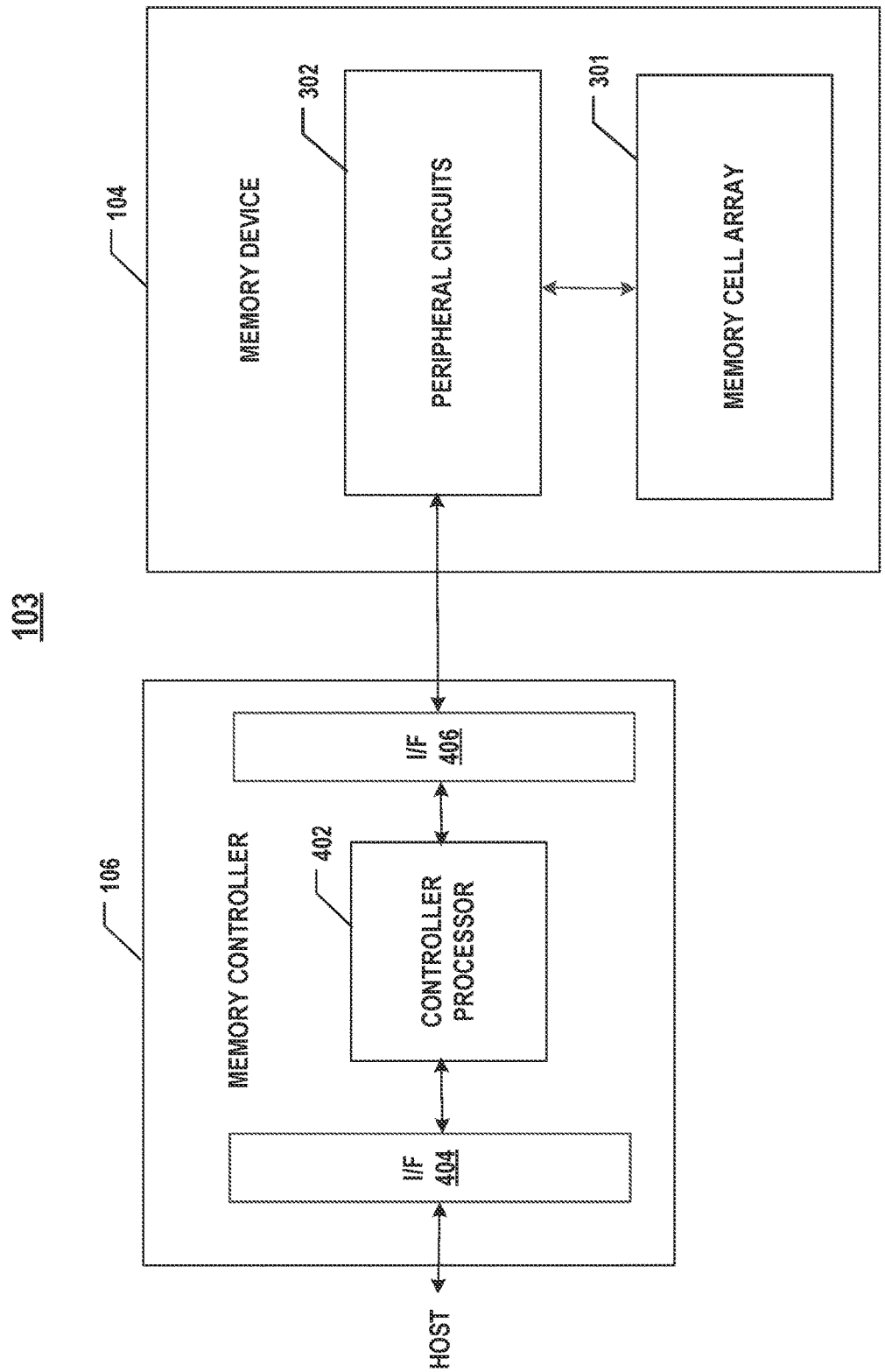
FIG. 4B illustrates a block diagram of an exemplary memory system having a memory device and a memory controller that includes a controller processor and interfaces, according to some aspects of the present disclosure.

FIG. 4B illustrates a block diagram of an exemplary memory system 103 having a non-volatile memory device 104 and a memory controller 106 that may include a controller processor 402 and interfaces 404 and 406, according to some aspects of the present disclosure. As shown in FIG. 4B, memory controller 106 can include controller processor 402, such as a memory chip controller (MCC) or a memory controller unit (MCU). Controller processor 402 can be configured to control modules of memory controller 106 and non-volatile memory device 104 to execute commands or instructions for performing functions disclosed in the present disclosure. In some examples, controller processor 402 can be configured to control the operations of each peripheral circuit 302 by generating and sending various signals, such as command signal CMD for read operations, as shown in FIG. 4A. In some examples, controller processor 402 can also send control signal CTRL (such as a clock signal) at various frequencies, periods, and duty cycles to peripheral circuits 302 to synchronize the operations of each peripheral circuit 302.

In some implementations, the interfaces contained in memory controller 106 may include a first memory controller interface 404 that can enable a host (e.g., host 102 in FIG. 1) to access and control memory system 103. First memory controller interface 404 may include a set of protocols, signals, and electrical characteristics that can define communication standards between memory controller 106 and the host, which can ensure that signals and data can be transmitted reliably and efficiently. In some instances, first memory controller interface 404 can be configured to enable the host processor to access and control non-volatile memory device 104, e.g., for the read/program operations. In some instances, first memory controller interface 404 may manage the timing and synchronization of data transfers. For example, a host processor (not shown) and memory controller 106 may be configured to synchronize their clocks and signals to ensure that the data is transferred without errors.

In some implementations, memory controller 106 may further include a second memory controller interface 406 that can facilitate the transfer of data and instructions between memory controller 106 and non-volatile memory device 104. Similar to first memory controller interface 404, second memory controller interface 406 may include a set of protocols, signals, and electrical characteristics that can define communication standards between memory controller 106 and non-volatile memory device 104.

Figure 4C:
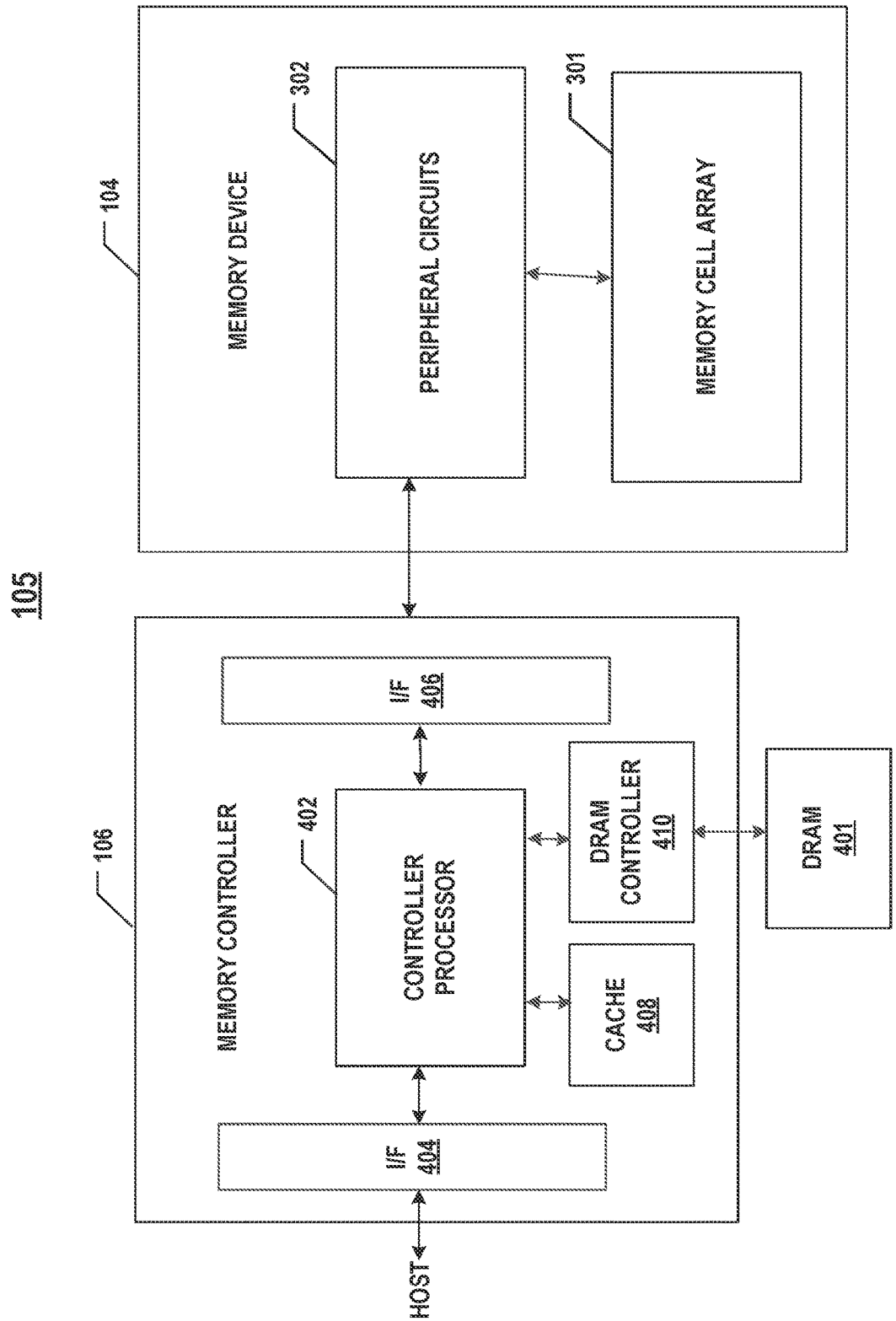
FIG. 4C illustrates a block diagram of another exemplary memory system having a memory device and a memory controller that includes one or more storage units, according to some aspects of the present disclosure.

FIG. 4C illustrates a block diagram of another exemplary memory system 105 having a non-volatile memory device 104 and a memory controller 106 that may further include one or more storage units, according to some aspects of the present disclosure. Based on the hierarchy shown in FIG. 4B, the one or more storage units may include a volatile controller memory, such as a register or a cache 408, which may allow for faster access and processing speeds for reading, programming, or erasing the data stored therein.

In some implementations, memory controller 106 may be connected to another volatile memory device located outside memory controller 106. For instance, a dynamic random-access memory (DRAM) device 401, which is external to memory controller 106, may be connected to a DRAM controller 410 in memory controller 106. In some implementations, cache 408 and/or DRAM device 401 can be configured to store a read-retry table (and an address mapping table if applicable), according to some implementations of the present disclosure. In some examples, cache 408 and/or DRAM device 401 may also be configured to store instructions that, when executed by controller processor 402, can perform a power-off recovery (POR) procedure in accordance with some implementations of the present disclosure. In some examples, cache 408 and/or DRAM device 401 may also be configured to store data written to or read from non-volatile memory device 104.

Figure 5:
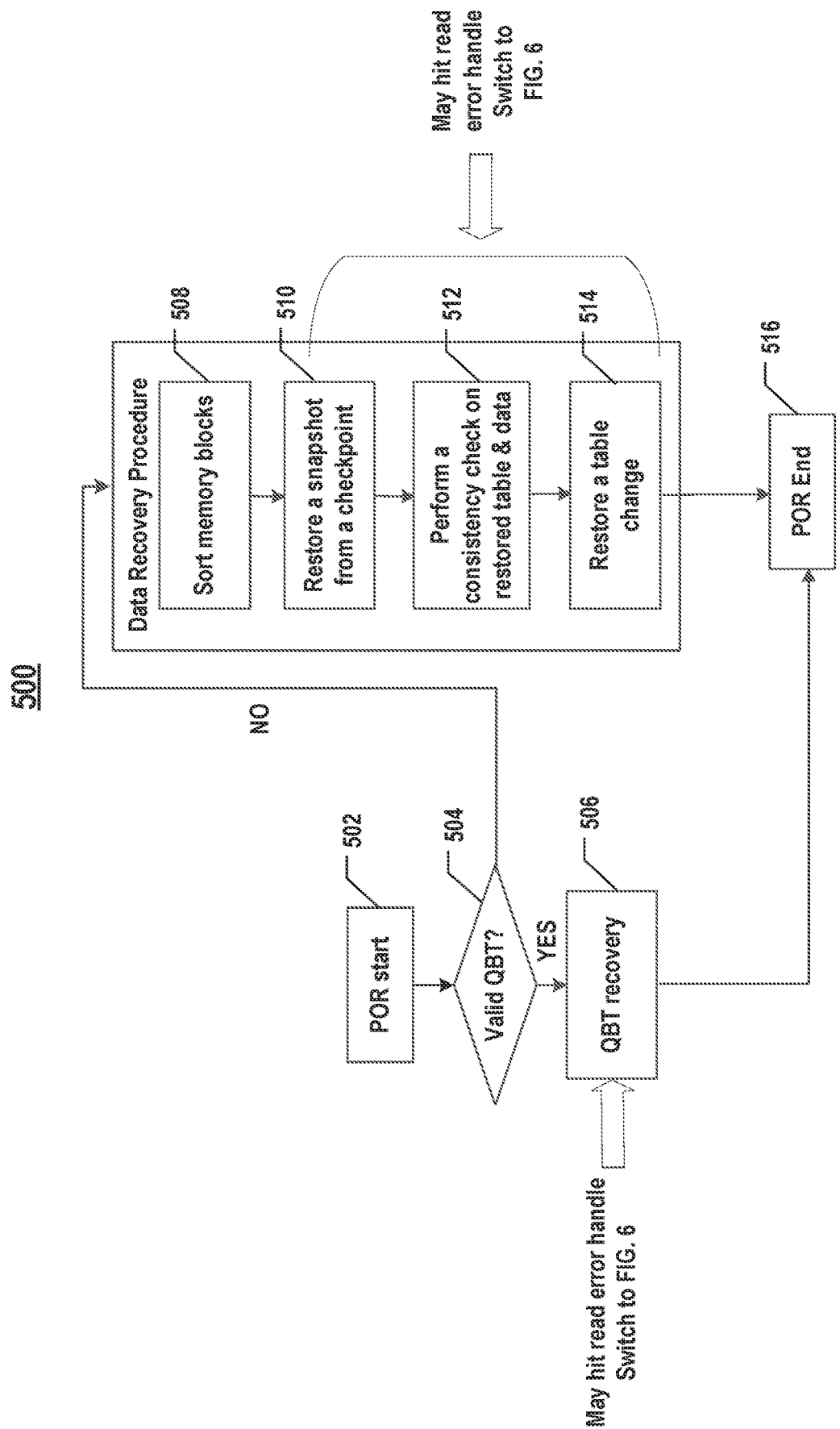
FIG. 5 illustrates a flow diagram of an exemplary power-off recovery (POR) procedure implemented in a memory system, according to some aspects of the present disclosure.

FIG. 5 illustrates a flow diagram of an exemplary power-off recovery (POR) procedure 500 implemented in a memory system (such as memory systems 101, 103, or 105), according to some aspects of the present disclosure. POR procedure 500 may enable the memory system to recover from the power loss or power-off, and restore the previous state of a memory device in the memory system when power is back.

When a power loss or power-off occurs, it can have negative impacts on a non-volatile memory device, such as an SSD. For instance, if the memory device is in the middle of reading/writing data when the power loss occurs, the data being read and written may be lost or corrupted, which can degrade the performance and efficiency of the memory device. With provided POR procedure 500, however, the memory system can not only restore the previous state of the memory device or recover the data when power is back, but also shorten power-on time through the reduced number of read-retry levels when handling read errors occurring in the POR procedure.

In the present disclosure, the terms "power loss" and "power-off" may refer to a power-off occurrence/event that can cause a memory device to lose power and data, without discussing whether the occurrence/event is intentional or unexpected, potentially leading to read errors or data corruption and can be used interchangeably. In response to power-on after a power-off occurrence, POR procedure 500 may start at 502, e.g., after power is back.

Subsequently, at 504, it may be determined whether a valid quick boot table (QBT) exists, according to some implementations. In case of a power loss or power-off, the QBT can be used to restore certain stored information by skipping some system configuration steps, allowing the memory system to resume its previous state and boot up more quickly. The term "QBT" may refer to a data structure that may facilitate faster system boot times by storing some system information, such as hardware or software configuration, in a dedicated table of a memory device. In some implementations, the QBT may be stored in a basic input/output system (BIOS) of the memory system, such as a hardware implementation in memory controller 106. In some implementations, the QBT may be stored in a memory unit other than non-volatile memory device 104 of the memory system. In some implementations, the QBT may include information such as system software configuration, system hardware configuration, and other suitable settings required for the memory system to boot up. In some implementations, memory controller 106 may be configured to check whether a valid QBT exists.

In response to determining that a valid QBT exists, a QBT recovery may be performed at 506, according to some implementations. In the present disclosure, the term "QBT recovery" may refer to the process of using the information stored in the QBT to recover a memory system after a power loss or power-off. When the memory system is powered on after a power loss, the firmware (e.g., implemented in memory controller 106) may check whether a valid QBT exists. In response to determining that a valid QBT was found, the memory system (e.g., memory controller 106) may use the information stored in the QBT to resume its previous state. This is a QBT recovery. The QBT recovery is typically faster than a full system boot since the memory system does not need to perform complete hardware initialization and software loading. In some implementations, memory controller 106 may transmit an address signal, an instruction signal, and other suitable signals to non-volatile memory device 104 to perform a read operation (e.g., on non-volatile memory device 104) to access the QBT for the QBT recovery. In some implementations, the instruction signal may include at least one of command signal CMD or control signal CTRL, as shown in FIG. 4A. The address signal may include a memory address (a location of non-volatile memory device 104) that memory controller 106 attempts to access, e.g., for the QBT. Once the QBT recovery is completed and determined to be successful, at 516, POR procedure 500 can be terminated.

In some scenarios, during the QBT recovery at 506, the memory system may encounter a read error as it attempts to access the stored QBT. As a consequence, the process may be switched to a read error handling procedure 600, shown in FIG. 6, for managing the read error. The term "read error in POR procedure" may refer to a scenario when, during the POR procedure, a read operation on the memory device fails in an error correction code (ECC) verification or other error-correcting mechanism. In some implementations, memory controller 106 may be configured to perform an ECC verification based on ECC codes.

It can also be understood that although a valid QBT may exist, the QBT recovery may not always be successful since there may still be data loss or corruption in the QBT. As a result, a data re-storage procedure, from 508 to 514, may be performed to rebuild data blocks, system blocks, system tables, etc., for the recovery of the memory device.

In response to determining that there is no valid QBT, POR procedure 500 may proceed to 508, where a data re-storage procedure may be initiated. In some examples, the data re-storage procedure from 508 to 514 may be performed by a firmware implementation, e.g., in memory controller 106. In some examples, the data re-storage procedure from 508 to 514 may be a SPOR (Sudden Power-off Recovery) procedure. The SPOR procedure is a recovery process designed to address issues such as abnormal power loss, normal power loss without timely prior data transfer to a memory device, and unreadable data during the QBT procedure that is hardly being recovered by an error-correcting mechanism. The SPOR procedure aims to ensure the integrity of data as much as possible. It employs a series of measures and algorithms to minimize data loss or inconsistencies.

At 508, memory blocks in the memory device of the memory system may be sorted based on the timestamps of the memory blocks. In some implementations, memory controller 106 may be configured to sort the memory blocks in the memory device.

In a case of a power loss or power-off, the memory blocks in a memory system may become disordered or corrupted. To restore the system to a functional and stable state, it may be necessary to sort the memory blocks according to their timestamps. Timestamps can be used to track when each memory block was last modified or accessed. By sorting the memory blocks based on their timestamps, the memory system can ensure that the most recent and relevant data can be restored with a higher priority.

POR procedure 500 may further proceed to 510. At 510, snapshots may be restored from corresponding checkpoints. As described above, in a power loss or power-off, memory blocks in a memory device may become disordered or corrupted, potentially leading to data loss or data corruption. To prevent these issues, in accordance with some implementations of the present disclosure, the memory system (e.g., memory controller 106) may implement a checkpoint technique to periodically generate a snapshot of the state of the memory system at a regular interval to make a record of all the changes to the memory device, e.g., in a log file. If a power loss occurs, the system can restore the most recent snapshot and then implement all the changes, e.g., from the log file. In some implementations, memory controller 106 may be configured to perform the restoration process.

Typically, a program operation may involve, e.g., a data block configured to store user data and a system block configured to store system information and changes made thereto to keep track of the system information. The system block can be a section of a file system that may include critical metadata about the file system, such as a location of a file system table (a.k.a., a file allocation table). The checkpoint technique can allow the memory system to save a copy of the current state and the data structure of the memory device, e.g., in a predetermined location. In case a power loss occurs, the memory system can restore the most recent checkpoint to bring the system back to its functional state. Restoring a snapshot from a checkpoint can be crucial, as it can provide a consistent state of the memory system, thereby ensuring data integrity and consistency of the memory device.

At 508, the sorting process of the memory blocks (e.g., the data block and the system block) can be performed (e.g., by memory controller 106) to identify any corrupted or inconsistent data that may need to be restored from corresponding checkpoints. Without the sorting process, it may be difficult to identify which data may need to be restored and which data may still be valid. That is, the sorting process may be crucial to ensure that the memory system can be restored to a stable state and that all the data is intact. Once the sorting process has identified any corrupted or inconsistent data, at 510, the checkpoint technique can be used to restore the memory system to a stable state. For example, the memory system (e.g., memory controller 106) may restore a snapshot of the memory system (e.g., regarding the data block and the system block) from a previous checkpoint when the memory system was stable. In some implementations, the checkpoint may include information such as system configuration settings.

POR procedure 500 may further proceed to 512, where the memory system (e.g., memory controller 106) may perform a consistency check on the restored table and data, according to some implementations of the present disclosure. The consistency check may be performed (e.g., by memory controller 106) to analyze a table in the system block as restored and compare it to the data as restored on the memory device. In some examples, the table may include a file allocation table used by a file system to keep track of the location of files stored in the memory device. In some implementations, the consistency check may include, e.g., performing a file system check to ensure that the restored data is accurate. For example, the table and data may be evaluated to ensure that file locations and sizes are consistent. In some implementations, the table may include a file system table configured to track a file location in the memory device and a partition table configured to define partitions of the memory device. Subsequently, in response to determining that the table and the data are consistent, the restoration operation on the data may be confirmed to be successful.

POR procedure 500 may further proceed to 514. At 514, a table change may be obtained based on a head block of the system blocks and applied to the table. In some implementations, memory controller 106 may be configured to apply the change to the table. The term "head block" may be used to refer to the first block of the system blocks. The head block may be configured to track changes made to the system table. For example, the changes may include adding or modifying entries in the table to reflect the new location of data on the memory device or marking memory sectors as bad or unreadable. The changes can be stored in another system block other than the head block. In some implementations, through the head block, the changes made to the system table can be recovered to reflect any modification during the power loss and/or recovery process. The data re-storage procedure can end at 516.

During the processes from 510 to 514, similarly, the memory system may encounter a read error. For example, in the process when the memory system rebuilds a system table (such as a file allocation table), a read error may occur as the memory system may attempt to read data from certain memory locations that contain the table. If those memory locations are damaged or corrupted (e.g., due to a power loss), the memory system may encounter a read error that prevents it from accessing the necessary data for rebuilding the table. Subsequently, the process may be switched to read error handling procedure 600, shown in FIG. 6, for managing the read error.

Figure 6:
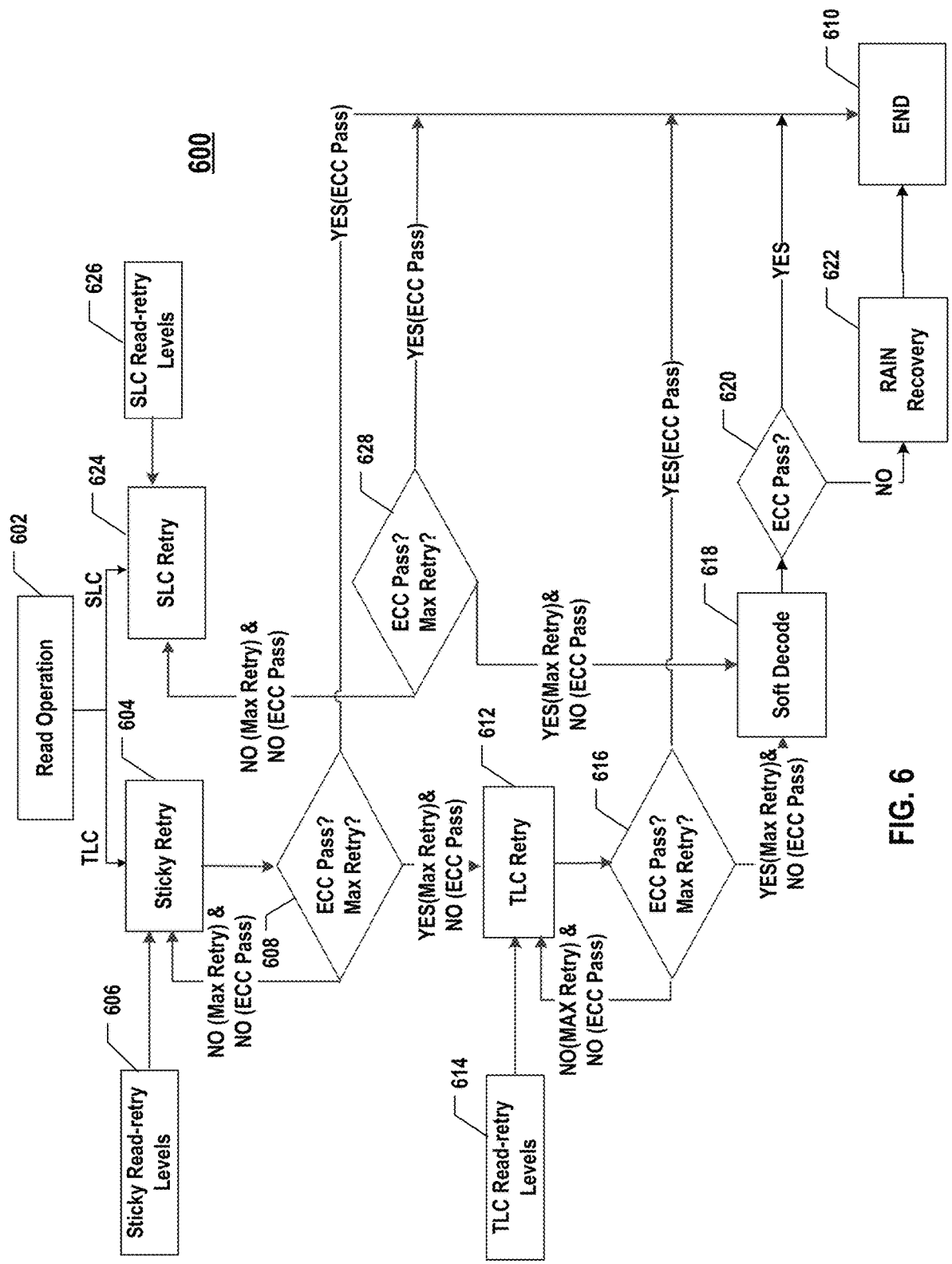
FIG. 6 illustrates a flow diagram of an exemplary read error handling procedure implemented in a POR procedure, according to some aspects of the present disclosure.

FIG. 6 illustrates a flow diagram of an exemplary read error handling procedure 600 implemented in a POR procedure, according to some aspects of the present disclosure. As described above, in a read operation on the memory device during POR procedure 500, the memory system may encounter one or more read errors, e.g., in the QBT recovery at 506, in the restoration of a snapshot from a checkpoint at 510, in the consistency check of the restored table and table at 512, and in the application of a table change at 514. In response to determining a read error during POR procedure 500, the memory system may attempt to correct the read error using read error handling procedure 600.

Read error handling procedure 600 implemented in POR procedure 500 may start at 602. Depending on whether memory cell 306 is an SLC that stores one bit of data or a TLC that stores three bits of data, read error handling procedure 600 may proceed to two different branches. In some examples, when memory cell 306 is a TLC, a sticky retry may be performed at 604.

The term "sticky retry" may be used to describe, if a memory device performs a read-retry operation at a particular voltage level after a read error, and the read error persists, the memory device may "stick" to the read-retry operation(s) at the same voltage level. In some implementations, the sticky retry process may be repeated a number of times (such as two times) before the memory device can forward to the next read-retry level. This sticky retry technique may help improve the reliability of memory systems by eliminating an occasional read error. In some implementations, the memory device may partially implement the sticky retry technique for certain errors or in certain memory locations having a higher likelihood of read errors. In some implementations, the sticky retry may be implemented globally for all memory locations in the memory device. In the present disclosure, the terms "sticky retry" and "sticky read-retry operation" may be used interchangeably.

Figure 7:
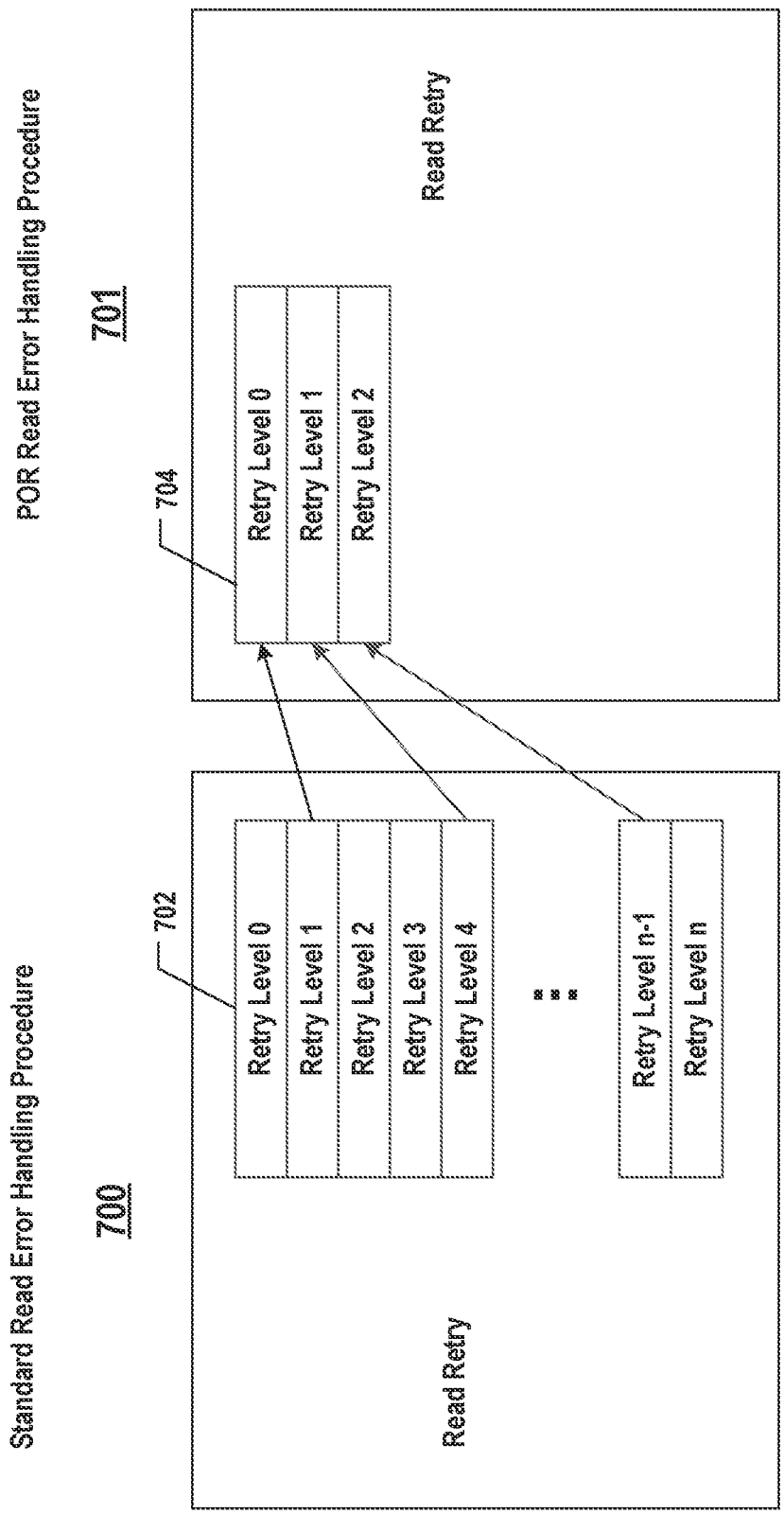
FIG. 7 illustrates a schematic diagram of an exemplary relation between standard read-retry levels (applied during a standard read error handling procedure) and POR read-retry levels (applied during a POR read error handling procedure), according to some aspects of the present disclosure.

Consistent with the scope of the present disclosure, in some implementations, sticky read-retry levels 606 may be used in sticky retry at 604. FIG. 7 illustrates a schematic diagram of an exemplary relation between standard read-retry levels 702 (applied during a standard read error handling procedure 700) and POR read-retry levels 704 (applied during a POR read error handling procedure 701), according to some aspects of the present disclosure. To some extent, sticky read-retry levels 606 can be equivalent, in meaning, to POR read-retry levels 704 shown in FIG. 7. That is, in some implementations, sticky read-retry levels 606 (shown as POR read-retry levels 704 shown in FIG. 7) can be a first portion of standard read-retry levels 702 applied during standard read error handling procedure 700.

In the present disclosure, the term "a first portion" may be used to describe that the number of sticky read-retry levels 606 may be less than the number of standard read-retry levels 702. In some implementations, each level of sticky read-retry levels 606 may be selected from standard read-retry levels 702. For example, as shown in FIG. 7, read-retry levels 0, 1, and 2 in sticky read-retry levels 606 may correspond to read-retry levels 1, 4, n−1 selected from standard read-retry levels 702. In some implementations, sticky read-retry levels 606 may include optimal read-retry voltages from previous successful read operations.

Moreover, the term "read-retry levels" may be used to refer to one or more voltage levels at which a read-retry operation can be attempted to recover data that was not correctly read out. When a memory device performs a read operation and encounters a read error, the memory system may retry the read operation(s) at a different voltage level. In some implementations, the memory device may apply multiple voltage levels at which it can perform the read-retry operations. In some implementations, the read-retry process may be repeated until the correct data is obtained or until all the available read-retry levels have been exhausted.

In some implementations, memory controller 106 (e.g., controller processor 402) may be configured to acquire sticky read-retry levels 606 from a read-retry table stored in, e.g., cache 408 and/or DRAM device 401. Memory controller 106 may be connected to DRAM device 401 through DRAM controller 410. Further, memory controller 106 may be configured to send an address signal, an instruction signal, and other suitable signals to non-volatile memory device 104 (more specifically, peripheral circuits 302) to perform one or more sticky read-retry operations on non-volatile memory device 104 based on sticky read-retry levels 606. In some implementations, the instruction signal may be generated according to sticky read-retry levels 606 and may include at least one of command signal CMD or control signal CTRL (as shown in FIG. 4A). The address signal may include a memory address (a location of non-volatile memory device 104) that memory controller 106 attempts to access for the sticky read-retry operation.

It can be understood that several factors can influence how many levels of read-retry operations need to be performed on a memory device. In some implementations, these factors may include at least one of the storage types of the memory cell in a memory device (e.g., an SLC or a TLC), the frequency of read errors as occurred previously, the data importance, the type of the memory device, the data retention ability of the memory cell, the fresh-out-of-box (FOB) level of the memory device, the block close/block open state of the memory block in the memory device, whether the memory device is a redundant system, or the error correction capability of the memory system, etc.

For example, if the data to be read out is critical, more read-retry levels may be required to ensure the data is accurate and reliable. This may relate to the cost of read-retry operations and the time constraint, as each read-retry operation may add the operation time and cost to the overall system latency and the system power. The type of memory device can also impact the number of read-retry levels. For example, certain types of memory devices may have higher error rates than others and may require more read-retry levels.

The term "FOB" may be used to describe the state of a memory device when it is brand new and has not been used or programmed yet. When a memory device is a FOB, it may describe a situation where the memory device may have some initial errors. Typically, a FOB memory device may have initial errors more frequently than a mature memory device. As a result, more read-retry levels may be necessary to ensure reliable data storage and retrieval. Therefore, the FOB level can become a factor for deciding the number of read-retry levels in read error handling procedure 600.

Regarding "block close" and "block open," for example, when a memory block is closed (i.e., programmed with data), it can create program disturbance in adjacent memory cells. In short, program disturbance is a phenomenon in which programming a memory cell causes disturbance to the charge level of adjacent memory cells, thus leading to read errors in those adjacent memory cells. The block close state of a memory block can increase the likelihood of read errors in subsequent read operations.

In the present disclosure, the term "read-retry levels" may be used to refer to, after the first read error, the number of read-retry operations that a memory system/device attempts to read data from a particular memory location before reporting a failure. For example, if the number of the read-retry levels is set to five (5), the memory system may attempt to read a certain location up to 5 times after the first read error. If all of the read-retry operations fail, the memory system may report a failure and mark the location as bad.

At 604, each sticky read-retry operation may be performed according to one level of sticky read-retry levels 606. At 608, upon each sticky read-retry operation, an error correction code (ECC) verification may be performed to determine whether a sticky read-retry operation passes a corresponding ECC verification, i.e., an ECC pass. The term "ECC verification" is used to refer to a technique used to detect and correct errors that can occur during data retrieval, and the term "ECC pass" refers to a successful ECC verification in a memory system. In some implementations, the ECC verification may work by adding one or more redundant bits to the data for verification to enable the detection and correction of errors. When an ECC verification is performed, the memory system may compare the one or more redundant bits with the original data to detect the errors.

In some implementations, in response to determining that a sticky read-retry operation passes the ECC verification, read error handling procedure 600 may proceed to 610 where the processes end. On the other hand, when there is an unsuccessful ECC verification (e.g., the sticky read-retry operation does not pass the ECC verification), the memory system may further determine whether all the sticky read-retry operations, based on each of sticky read-retry levels 606, have been performed. If there are still one or more sticky read-retry levels that are not being used, one or more sticky read-retry operations may still be performed based on the unused level(s). As a consequence, the process may return to 608. However, in response to determining that the number of the sticky read-retry operations reaches their maximum limit (i.e., all sticky read-retry levels were used), read error handling procedure 600 may proceed to 612, where a TLC retry may be initiated when memory cell 306 is a TLC.

Some memory devices, such as a NAND flash memory device, can store data in memory cells that can store multiple bits of information. Although this feature allows for higher storage density, it can also lead to more read errors. TLC retry or TLC read-retry operation is a feature designed to mitigate these errors by allowing the memory device to automatically adjust the read threshold voltage for the memory device, improving the accuracy of the read operations.

Compared to sticky retry, which can be used on a wide range of memory devices, TLC retry can be more specific. Therefore, sticky retry can be applied before TLC retry. In TLC retry, after a read operation fails at a particular voltage level, the memory device may move on to the next read-retry level and perform a read-retry operation at that level. This process will be repeated when all the available read-retry levels are used (i.e., a maximum limit is reached) or a successful read operation is obtained. By contrast, the sticky retry process may be repeated a fixed number of times (such as two times) before the memory device can forward to the next read-retry level. In some implementations, by using sticky retry before resorting to TLC retry, the memory device can recover data more effectively and efficiently.

During the TLC retry, the memory device may attempt to read data from a TLC memory cell with different voltage levels. This process can help recover the data that was previously unreadable. In some implementations, the TLC read-retry operations may be performed according to TLC read-retry levels 614. In some implementations, TLC read-retry levels 614 may be a second portion of standard read-retry levels 702 applied during standard read error handling procedure 700. The term "a second portion" may be used to describe that the number of TLC read-retry levels 614 may be less than the number of standard read-retry levels 702. In some implementations, each of TLC read-retry levels 614 may be selected from standard read-retry levels 702. The second portion of standard read-retry levels 702 (i.e., TLC read-retry levels 614) may be identical or different from the first portion of standard read-retry levels 702 (i.e., sticky read-retry levels 606). In some implementations, the number of TLC read-retry levels 614 may be greater than the number of sticky read-retry levels 606.

In some implementations, memory controller 106 (e.g., controller processor 402) may be configured to acquire TLC read-retry levels 614 from, e.g., cache 408 and/or DRAM device 401. Memory controller 106 may be connected to DRAM device 401 through DRAM controller 410. Further, memory controller 106 may be configured to send an address signal, an instruction signal, and other suitable signals to non-volatile memory device 104 to perform one or more TLC read-retry operations on non-volatile memory device 104 based on TLC read-retry levels 614. In some implementations, the instruction signal may be generated according to TLC read-retry levels 614 and may include at least one of command signal CMD or control signal CTRL (as shown in FIG. 4A). The address signal may include a memory address (a location of non-volatile memory device 104) that memory controller 106 attempts to access for the TLC read-retry operation.

At 616, similarly, upon each TLC read-retry operation, an error correction code (ECC) verification may be performed to determine whether a TLC read-retry operation passes, i.e., an ECC pass. In some implementations, in response to determining that a TLC read-retry operation passes the ECC verification, read error handling procedure 600 may proceed to 610 where the processes end. On the other hand, in response to determining that there is an unsuccessful ECC verification (i.e., the TLC read-retry does not pass the ECC verification), the memory system may further check whether all the TLC read-retry operations, based on each of TLC read-retry levels 614, have been performed. If there are still one or more TLC read-retry levels 614 that are not being used, one or more TLC read-retry operations may be performed based on the unused levels. As a result, the processes may return to 612. In some implementations, in response to determining that the number of the TLC read-retry operations reach their maximum limit (i.e., all TLC read-retry levels were used), read error handling procedure 600 may proceed to 618, where a soft decoding operation starts.

Different from a hard decoding operation that physically repairs/replaces a damaged hardware component, a soft-decoding operation may use error-correction algorithms to reconstruct/recover missing or corrupted data based on healthy or damaged data. The soft-decoding operation may include error-detection codes that were calculated and stored in the memory device. In some implementations, the soft decoding processes may be performed by evaluating the parity information of the healthy and/or damaged data in the memory device to reconstruct the missing or corrupted data.

In some cases, it may not be possible to recover all of the missing and corrupted data based on the remaining data, which may highly depend on, e.g., the damage level of the memory device. In some implementations, upon the soft decoding operation, an ECC verification may be performed at 620 to evaluate the performance of the soft decoding operation. If the soft decoding operation passes the ECC verification, read error handling procedure 600 may proceed to 610 where the processes end. Otherwise, it may further proceed to 622 where a redundant array of independent NANDs (RAIN) recovery may be performed.

One goal of a RAIN array is to improve data availability and/or performance by distributing data across multiple disks (e.g., multiple NANDs) and/or duplicating data across multiple disks. At 622, using the RAIN recovery, the data on a failed disk can be reconstructed from the remaining disks in the memory device. In some implementations, the RAIN recovery may include copying data from the remaining disks and using the parity or redundancy information of the data to reconstruct missing and corrupted data. The process may end at 610.

As described above, the proposed POR read error handling procedure 600 includes two branches, one for TLC memory cells and the other for SLC memory cells. When memory cell 306 is an SLC that stores one bit of data, read error handling procedure 600 may proceed to 624 where an SLC read-retry operation may be performed.

In some implementations, in this branch, there is no sticky retry being performed. Considering that an SLC only involves one bit of data storage, therefore, it is less likely that multiple read attempts may be required to recover the data with SLC. It turns out that SLC retry may be more reliable than TLC retry, so a sticky retry may not be required.

Consistent with the scope of the present disclosure, in some implementations, SLC read-retry levels 626 may be used in SLC retry at 624. SLC read-retry levels 626 may be a third portion of standard read-retry levels 702 applied during standard read error handling procedure 700. The term "a third portion" may be used to describe that the number of SLC read-retry levels 626 may be less than the number of standard read-retry levels 702. In some implementations, each of SLC read-retry levels 626 may be selected from standard read-retry levels 702. The third portion of standard read-retry levels 702 contained in SLC read-retry levels 626 may be identical or different from the first portion of standard read-retry levels 702 contained in sticky read-retry levels 606. The third portion of standard read-retry levels 702 contained in SLC read-retry levels 626 may be identical or different from the second portion of standard read-retry levels 702 contained in TLC read-retry levels 614. In some implementations, the number of TLC read-retry levels 614 may be greater than each of the number of sticky read-retry levels 606 and the number of SLC read-retry levels 626.

In some implementations, memory controller 106 (e.g., controller processor 402) may be configured to acquire SLC read-retry levels 626 from, e.g., cache 408 and/or DRAM device 401. Memory controller 106 may be connected to DRAM device 401 through DRAM controller 410. Further, memory controller 106 may be configured to send an address signal, an instruction signal, and other suitable signals to non-volatile memory device 104 to perform one or more SLC read-retry operations on non-volatile memory device 104 based on SLC read-retry levels 626. In some implementations, the instruction signal may be generated according to SLC read-retry levels 626 and may include at least one of command signal CMD or control signal CTRL (as shown in FIG. 4A). The address signal may include a memory address (a location of non-volatile memory device 104) that memory controller 106 attempts to access for the SLC read-retry operation.

Similarly, an ECC verification may be performed to determine whether the SLC read-retry operation passes. In response to determining that the SLC retry passes the ECC verification, the process may proceed to 610, where the procedure ends. In response to determining that the SLC retry does not pass a corresponding ECC verification and there is a remaining SLC read-retry level not being used, the process may return to 624, where one or more SLC read-retry operations may be performed. In response to determining that the SLC retry does not pass the ECC verification, but all of the SLC read-retry levels were already used for the SLC read-retry operations, the process may proceed to 618 where a soft decoding operation 618 can be performed. Subsequently, depending on whether or not the soft decoding operation 618 passes the ECC verification, a RAIN recovery can be performed at 620, or procedure 600 can be terminated at 610.

In some aspects of the present disclosure, a non-transitory computer-readable storage medium is provided. The storage medium may be configured to store computer-executable instructions. When being executed by, e.g., controller processor 402 of memory controller 106, the executed instructions cause memory controller 106 to perform the above-described operations and functions. For example, the executed instructions may cause memory controller 106 to, in response to determining a power-off occurrence of a memory system that may include a memory device, initiate a power-off recovery (POR) procedure on the memory system. In response to determining that a read error occurs during the POR procedure, memory controller 106 may further perform one or more first read-retry operations on the memory device based on a plurality of first read-retry levels. The plurality of first read-retry levels may be a portion of a plurality of second read-retry levels that are applied, during a standard read error handling procedure, in one or more second read-retry operations on the memory device.

In view of the above, some implementations of the present invention provide an inventive read error handling flow implemented in a POR procedure. Based on the read error handling flow, the number of the read-retry levels can be reduced, and the POR procedure can thus be simplified. Consequently, the power-on time can be shortened.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations but should be defined only in accordance with the following claims and their equivalents.

What is claimed is:

1. A method for operating a memory system that comprises a memory device, comprising:
   determining whether a power-off of the memory system occurs;
   in response to determining a power-off occurrence of the memory system, initiating a power-off recovery (POR) procedure on the memory system;
   determining whether a read error occurs during the POR procedure; and
   in response to determining that a read error occurs during the POR procedure:
      obtaining a plurality of second read-retry levels that are applied during a standard read error handling procedure, and selecting a subset of the plurality of second read-retry levels to form a plurality of first read-retry levels, one or more second read-retry operations being performed with the plurality of second read-retry levels in the standard read error handling procedure; and performing one or more first read-retry operations on the memory device based on the plurality of first read-retry levels.

2. The method of claim 1, wherein the read error, during the POR procedure, comprises at least one of:
a first read error occurring in a quick boot table (QBT) recovery;
a second read error occurring in restoring a table and data from a snapshot of a checkpoint;
a third read error occurring in evaluating whether the table and data as restored are consistent; or
a fourth read error occurring in updating the table.

3. The method of claim 1, further comprising:
determining that the read error occurs when it is determined that, during the POR procedure, a read operation on the memory device fails in an error correction code (ECC) verification.

4. The method of claim 1, wherein:
in response to determining the power-off occurrence, initiating the POR procedure comprises determining whether a valid quick boot table (QBT) exists; and
the method further comprises:
in response to determining that a valid QBT exists, performing QBT recovery; and
in response to determining that there is no valid QBT, performing a data re-storage procedure.

5. The method of claim 4, wherein performing the data re-storage procedure comprises:
sorting memory blocks in the memory device according to timestamps;
restoring a table and data from a snapshot of a checkpoint based on the memory blocks as sorted;
evaluating whether the table and data as restored are consistent; and
applying a change to the table according to a memory block of the memory blocks as restored.

6. The method of claim 1, wherein:
each of the first read-retry levels is selected from the second read-retry levels; and
a number of the first read-retry levels is less than a number of the second read-retry levels.

7. The method of claim 1, wherein:
the first read-retry levels are selected, from the second read-retry levels, according to at least one of a storage type of a memory cell in the memory device, a frequency of read errors, data importance, a type of the memory device, a data retention ability of the memory cell, a fresh-out-of-box (FOB) level of the memory device, a block close/block open state of a memory block in the memory device, whether the memory device is a redundant system, or error correction capability of the memory system.

8. The method of claim 1, wherein:
the memory device comprises a triple-level cell (TLC); and
the method further comprises, in response to determining that the read error occurs during the POR procedure:
performing one or more sticky read-retry operations on the memory device based on a plurality of sticky read-retry levels, wherein one sticky read-retry level from the plurality of sticky read-retry levels is applied for more than one time in a corresponding sticky read-retry operation;
determining whether each of the one or more sticky read-retry operations fails in a corresponding ECC verification; and
in response to determining that each of the one or more sticky read-retry operations fails in the corresponding ECC verification, performing one or more TLC read-retry operations on the memory device based on a plurality of TLC read-retry levels, the sticky read-retry levels being a first portion of the second read-retry levels, the TLC read-retry levels being a second portion of the second read-retry levels, and a number of the one or more sticky read-retry operations being equal to a number of the sticky read-retry levels.

9. The method of claim 8, further comprising:
determining whether each of the one or more TLC read-retry operations fails in a corresponding ECC verification;
in response to determining that each of the one or more TLC read-retry operations fails in the corresponding ECC verification, performing soft decoding on the memory device, a number of the one or more TLC read-retry operations being equal to a number of the TLC read-retry levels; and
in response to determining that the soft decoding fails in a corresponding ECC verification, performing redundant array of independent NANDs (RAIN) recovery.

10. The method of claim 1, wherein:
the memory device comprises a single-level cell (SLC); and
the method further comprises, in response to determining that the read error occurs during the POR procedure, performing one or more SLC read-retry operations on the memory device based on a plurality of SLC read-retry levels.

11. The method of claim 10, further comprising:
determining whether each of the one or more SLC read-retry operations fails in a corresponding ECC verification;
in response to determining that each of the one or more SLC read-retry operations fails in the corresponding ECC verification, performing soft decoding on the memory device, a number of the one or more SLC read-retry operations being equal to a number of the SLC read-retry levels; and
in response to determining that the soft decoding fails in a corresponding ECC verification, performing RAIN recovery.

12. A non-transitory computer-readable storage medium configured for storing computer-executable instructions that, when executed by a hardware processor, cause the hardware processor to:
determine whether a power-off of a memory system that comprises a memory device occurs;
in response to determining a power-off occurrence of the memory system, initiate a power-off recovery (POR) procedure on the memory system;
determine whether a read error occurs during the POR procedure; and
in response to determining that a read error occurs during the POR procedure:
obtain a plurality of second read-retry levels that are applied during a standard read error handling procedure, and select a subset of the plurality of second read-retry levels to form a plurality of first read-retry levels, one or more second read-retry operations being performed with the plurality of second read-retry levels in the standard read error handling procedure; and perform one or more first read-retry operations on the memory device based on the plurality of first read-retry levels.

13. A memory system, comprising:
a memory device; and
a memory controller configured to:
   determine whether a power-off of the memory system occurs;
   in response to determining a power-off occurrence of the memory system, initiate a power-off recovery (POR) procedure;
   determine whether a read error occurs during the POR procedure; and
   in response to determining that a read error occurs during the POR procedure:
      obtain a plurality of second read-retry levels that are applied during a standard read error handling procedure, and select a subset of the plurality of second read-retry levels to form a plurality of first read-retry levels, one or more second read-retry operations being performed with the plurality of second read-retry levels in the standard read error handling procedure; and
      send a first address signal and a first instruction signal to the memory device to perform one or more first read-retry operations on the memory device, the first instruction signal being generated based on the plurality of first read-retry levels.

14. The memory system of claim 13, wherein the read error, during the POR procedure, comprises at least one of:
a first read error occurring in a quick boot table (QBT) recovery;
a second read error occurring in restoring a table and data from a snapshot of a checkpoint;
a third read error occurring in evaluating whether the table and data as restored are consistent; or
a fourth read error occurring in updating the table.

15. The memory system of claim 13, wherein:
the first read-retry levels are selected, from the second read-retry levels, according to at least one of a storage type of a memory cell in the memory device, a frequency of read errors, data importance, a type of the memory device, a data retention ability of the memory cell, a fresh-out-of-box (FOB) level of the memory device, a block close/block open state of a memory block in the memory device, whether the memory device is a redundant system, or error correction capability of the memory system.

16. The memory system of claim 13, wherein:
the memory device comprises a triple-level cell (TLC); and
the memory controller is further configured to, in response to determining that the read error occurs during the POR procedure:
   send a first and a second instruction signal to the memory device to perform one or more sticky read-retry operations on the memory device based on a plurality of sticky read-retry levels;
   determine that each of the one or more sticky read-retry operations fails in a corresponding error correction code (ECC) verification; and
   in response to determining that each of the one or more sticky read-retry operations fails in the corresponding error correction code (ECC) verification, send a third address signal and a third instruction signal to the memory device to perform one or more TLC read-retry operations on the memory device based on a plurality of TLC read-retry levels, the sticky read-retry levels being a first portion of the second read-retry levels, the TLC read-retry levels being a second portion of the second read-retry levels, and a number of the one or more sticky read-retry operations being equal to a number of the sticky read-retry levels.

17. The memory system of claim 13, wherein:
the memory device comprises a single-level cell (SLC); and
the memory controller is further configured to, in response to determining that the read error occurs during the POR procedure, send a fourth address signal and a fourth instruction signal to the memory device to perform one or more SLC read-retry operations on the memory device based on a plurality of SLC read-retry levels.

18. The memory system of claim 13, wherein the memory controller is further configured to:
retrieve the first read-retry levels from a read-retry table.

19. The memory system of claim 18, wherein:
the memory device is configured to store the read-retry table.

20. The memory system of claim 18, wherein:
the memory device is a first memory device in the memory system;
a second memory device, external to the memory system, is configured to store the read-retry table; and
the memory controller is further configured to access the second memory device to obtain the first read-retry levels from the read-retry table in the second memory device.

* * * * *